(12) United States Patent
Li et al.

(10) Patent No.: US 11,621,388 B2
(45) Date of Patent: Apr. 4, 2023

(54) METHOD FOR MANUFACTURING JOSEPHSON JUNCTIONS

(71) Applicant: IQM Finland Oy, Espoo (FI)

(72) Inventors: Tianyi Li, Espoo (FI); Wei Liu, Espoo (FI); Manjunath Ramachandrappa Venkatesh, Espoo (FI); Hasnain Ahmad, Espoo (FI); Kok Wai Chan, Espoo (FI); Kuan Yen Tan, Espoo (FI)

(73) Assignee: IQM Finland Oy, Espoo (FI)

( * ) Notice: Subject to any disclaimer, the term of this patent is extended or adjusted under 35 U.S.C. 154(b) by 0 days.

(21) Appl. No.: 17/542,110

(22) Filed: Dec. 3, 2021

(65) Prior Publication Data
US 2022/0181538 A1 Jun. 9, 2022

(30) Foreign Application Priority Data
Dec. 7, 2020 (EP) .................... 20212122

(51) Int. Cl.
| | | |
|---|---|---|
| *H01L 39/24* | (2006.01) | |
| *H01L 39/22* | (2006.01) | |
| *H01L 39/02* | (2006.01) | |
| *G06N 10/00* | (2022.01) | |
| *H01L 27/18* | (2006.01) | |
| *G06N 10/40* | (2022.01) | |

(52) U.S. Cl.
CPC ......... *H01L 39/2493* (2013.01); *G06N 10/00* (2019.01); *H01L 27/18* (2013.01); *H01L 39/025* (2013.01); *H01L 39/223* (2013.01); *G06N 10/40* (2022.01)

(58) Field of Classification Search
CPC ... H01L 39/2493; H01L 27/18; H01L 39/025; H01L 39/223; G06N 10/40; G06N 10/00
See application file for complete search history.

(56) References Cited

U.S. PATENT DOCUMENTS

| | | |
|---|---|---|
| 2019/0296214 A1 | 9/2019 | Yoscovits et al. |
| 2019/0363239 A1 | 11/2019 | Yoscovits et al. |
| | (Continued) | |

FOREIGN PATENT DOCUMENTS

| | | | |
|---|---|---|---|
| CN | 107016442 | 8/2017 | |
| JP | 2000216447 A | * 8/2000 | ............. B82Y 10/00 |
| | (Continued) | | |

OTHER PUBLICATIONS

Wang et al., "Three-dimensional arrays of BiSrCaCuo-2212 intrinsic Josephson junctions and zero-crossing Shapiro steps at 760 GHz", Applied Physics Letters, A I P Publishing LLC, US, vol. 80, No. 9, Mar. 4, 2002 (Mar. 4, 2002) pp. 1604-1606, XP012031720, ISSN: 0003-6951, DOI: 10.1063/1.1456555 (Year: 2002).*

(Continued)

*Primary Examiner* — Aaron J Gray
(74) *Attorney, Agent, or Firm* — K&L Gates LLP

(57) ABSTRACT

The present invention relates to the manufacture of Josephson junctions. Such Josephson junctions may be suitable for use in qubits. High-quality, potentially monocrystalline, electrode and dielectric layers are formed using blanket deposition. Subsequently, the structure of one of more Josephson junctions is formed using multi-photon lithography to create openings in a resist followed by etching the electrode and dielectric layers.

15 Claims, 11 Drawing Sheets

(56) References Cited

U.S. PATENT DOCUMENTS

2020/0365397 A1    11/2020  Megrant
2022/0181535 A1*  6/2022  Holmes ................ H01L 39/045

FOREIGN PATENT DOCUMENTS

| JP | 2002246665 | A | * | 8/2002 |
| JP | 2011233825 | A | * | 11/2011 |
| WO | 2018030977 | | | 2/2018 |

OTHER PUBLICATIONS

Kim et al., "New approach for fabricating submicron scale intrinsic Josephson junctions using high-T'c superconducting materials" Physica C, North-Holland Publishing, Amsterdam, NL, vol. 362, No. 1-4, Sep. 1, 2001 (Sep. 1, 2001), pp. 150-155, XP003319540, ISSN: 0921-4534, DOI: 10.1016/S0921-4534 (Year: 2001).*

European Search Report issued to EP Application No. 20212122.4, dated May 19, 2021, 3 pages.

Shuuichi et al. "Vortex Penetrations in Parallel-connected two Stacks of Intrinsic Josephson Junctions", Physics Procedia, Elsevier, Amsterdam, NL, vol. 81, May 10, 2016, pp. 85-88, XP029532518, ISSN: 1875-3892, DOI: 10.1016/J. PHPRO.2016.04.033, *p. 86, line 19-87, line 5; figure 1*.

Kim et al., "New approach for fabricating submicron scale intrinsic Josephson junctions using high-T'c superconducting materials" Physica C, North-Holland Publishing, Amsterdam, NL, vol. 362, No. 1-4, Sep. 1, 2001 (Sep. 1, 2001), pp. 150-155, XP003319540, ISSN: 0921-4534, DOI: 10 1016/S0921-4534 (01) 99662-1, *p. 151, left-handed column, line 15—p. 152, left-handed column, line 23; figures 1, 2*.

Kawae et al., "Influence of charging energy on cooper pair tunneling in Bi-2212 small intrinsic Josephson junctions", IEEE Transactions in Applied Superconductivity, IEEE Service Center, Los Alamitos, CA, US vol. 13, No. 2, Jun. 1, 2003 (Jun. 1, 2003), pp. 897-900, XP011097921, ISSN: 1051-8223, DOI: 10.1109/TASC.2003. 814074 *figure 1*.

Wang et al., "Three-dimensional arrays of BiSrCaCuo-2212 intrinsic Josephson junctions and zero-crossing Shapiro steps at 760 GHz", Applied Physics Letters, A I P Publishing LLC, US, vol. 80, No. 9, Mar. 4, 2002 (Mar. 4, 2002) pp. 1604-1606, XP012031720, ISSN: 0003-6951, DOI: 10.1063/1.1456555 *p. 1604, right-hand column, line 22—p. 1605, left-handed column, line 35; figures 1, 2*.

Hatano et al., "A4-bit, 250-MIPS processor using Josephson technology", IEEE Micro, IEEE Service Center, Los Alamitos, CA, US, vol. 10, No. 2, Apr. 1, 1990 (Apr. 1, 1990), pp. 40-55, XP011417466, ISSN: 0272-1732 DOI: 10.1109/40.52946 *figure 1*.

Shuuichi et al., "Size Dependence of Individual Vortex Penetration into Intrinsic Josephson Junction Stacks of Bi2Sr2CaCu208+y", Physics Procedia, Elsevier, Amsterdam, NL, vol. 65, Jun. 20, 2015 (Jun. 20, 2015), pp. 109-112, XP029178295, ISSN: 1875-3892, DOI: 10.1016/J.PHPRO.2015.05.146 *p. 110, line 7-line 17; figure 1*.

Taiwanese Search Report issued in related Application No. 110142395, dated Nov. 15, 2022, 3 pages.

\* cited by examiner

METHOD FOR MANUFACTURING JOSEPHSON JUNCTIONS

PRIORITY CLAIM

This application claims priority to European Patent Application No. 20212122.4, filed on Dec. 7, 2020, the entire disclosure of which is incorporated by reference herein.

TECHNICAL FIELD

The present invention relates to the manufacture of Josephson junctions, such as may be suitable for use in qubits.

BACKGROUND

Josephson junctions are the core elements of superconducting qubits, with their quality being the dominating factor of the lifetime of the qubits. Traditionally, the Josephson junctions used in superconducting qubits are fabricated using shadow evaporation: where a hollow structure is defined on a resist by lithography, allowing aluminium films deposited from different angles overlapping with each other, with an in-situ oxidation process in between, followed by lift-off. The aluminium film and the aluminium oxide layer formed in this way are typically polycrystalline, with a grain size of approximately 10 nanometers ("nm"), which is significantly smaller than the size of the junctions at approximately 100 nm.

In practice, a "macroscopic" Josephson junction is made up of many smaller "microscopic" junctions stitched together. The supercurrent density is not uniform due to the different lattice orientation and thicknesses of the aluminium oxide layers in each of the "microscopic" junctions. As a result, the critical current (and normal state resistance) of the "macroscopic" junction is difficult to control. The non-uniform tunnelling and two-level-systems arising on the grain boundaries also shorten the qubit lifetime.

SUMMARY

According to the present invention, a method of manufacturing a Josephson junction is provided. The method comprises:
forming a stack on a substrate, the stack comprising a first electrode layer, a dielectric layer, and a second electrode layer, the stack defining at least an upper surface, on the opposite face of the stack to the substrate, and two side surfaces adjacent to the substrate and the upper surface;
forming a trench in the stack via a first opening in a resist, the trench extending across the full width of the stack and extending across the full depth of the second electrode layer and the dielectric layer; and
forming a tunnel in the stack via a second opening and a third opening in a resist, the second and third openings being formed by multi-photon lithography, the tunnel extending across the full width of the stack from the second opening to the third opening and extending across the full depth of the first electrode layer and the dielectric layer.

Prior to forming the stack, the method may comprise forming the first electrode layer, the dielectric layer, and the second electrode layer and etching the first electrode layer, the dielectric layer, and the second electrode layer into the shape of a superconducting quantum interference device ("SQUID") loop. The SQUID loop shape is characterised by an elongated body which extends parallel to the substrate and includes an opening that extends perpendicular to the substrate through the first electrode layer, dielectric layer, and second electrode layer. The opening is enclosed on all sides by the first electrode layer, dielectric layer, and second electrode layer. The sides of the opening that run parallel to the longitudinal axis of the elongated body are referred to as "branches" of the SQUID loop.

The SQUID loop shape may be formed by etching the first electrode layer, the dielectric layer, and the second electrode layer via an opening in a resist.

The stack may be formed from one of the branches of the SQUID loop.

The first electrode layer, the dielectric layer, and the second electrode layer may be formed by blanket deposition using physical vapor deposition ("PVD") or molecular beam epitaxy ("MBE"), after pre-treatment such as a hydrofluoric acid ("HF") rinse and/or in-situ annealing of the substrate.

Forming the trench may comprise forming a first resist over the stack covering at least the upper face and side faces, creating the first opening in the first resist that exposes a portion of the upper surface of the stack, and wet or dry etching the stack to form the trench.

Forming the tunnel may comprise forming a second resist over the stack covering at least the upper face and side faces, creating the second and third openings in the second resist, the second opening exposing a portion of a first side surface of the stack, the third opening exposing a portion of a second side surface of the stack opposite to the first side surface, the third opening being the same size as the second opening and being located opposite the second opening, and wet or dry etching the stack to form the tunnel.

Alternatively, forming the tunnel may comprise creating the second and third openings in the first resist, the second opening exposing a portion of a first side surface of the stack, the third opening exposing a portion of a second side surface of the stack opposite to the first side surface, the third opening being the same size as the second opening and being located opposite the second opening, and wet or dry etching the stack to form the tunnel simultaneously with wet or dry etching the stack to form the trench.

The method may further comprise controlling etch time of the trench so that etching stops before first electrode layer is completely etched and/or controlling etch time of the trench so that etching stops before the second electrode layer is completely etched.

The first and second electrode layers may be aluminium, and the dielectric layer may be an aluminium oxide.

The aluminium oxide of the dielectric layer may have a monocrystalline structure.

The method may further comprise steps of connecting the first electrode layer and/or second electrode layer to one or more further electrical components to form a qubit.

DETAILED DESCRIPTION

Figure 1A:
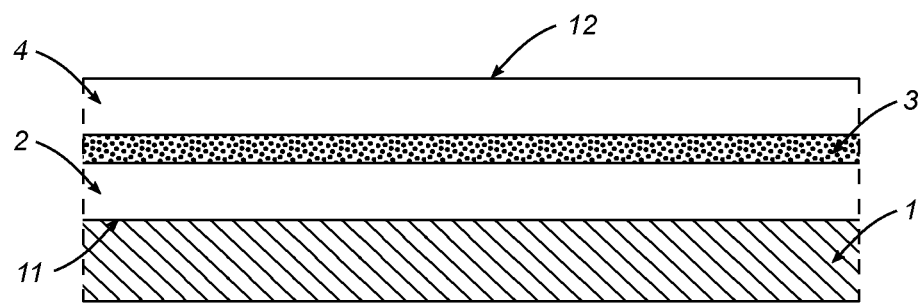
FIG. 1A is a diagram of a cross-sectional view of an electrode stack on a substrate for manufacturing a Josephson junction, according to an example embodiment of the present invention.
Figure 1B:
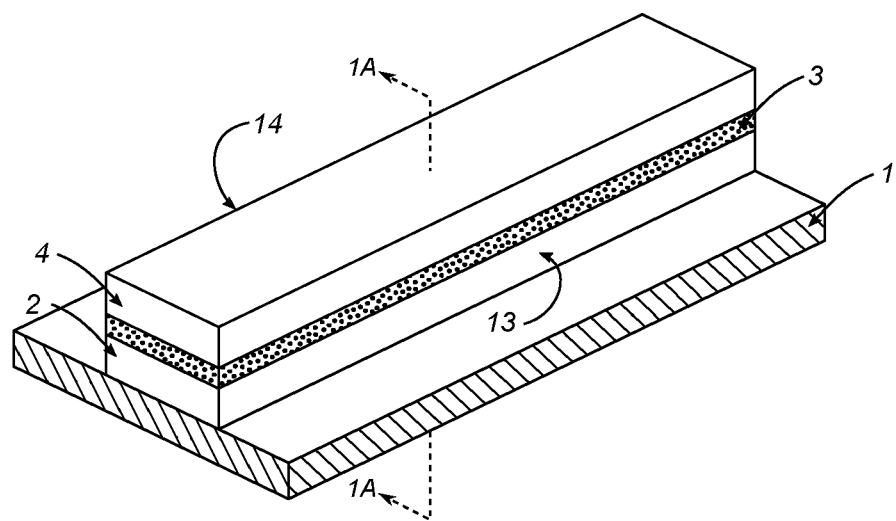
FIG. 1B is a diagram of a perspective view of the electrode stack of FIG. 1A, according to an example embodiment of the present invention.

At a first stage of the fabrication method, the end result of which is depicted in FIGS. 1A and 1B, a stack is formed on a substrate 1. The stack includes a first electrode layer 2, a dielectric layer 3, and a second electrode layer 4. The first electrode layer 2 is adjacent to the substrate 1 and the lower face 11 of the first electrode layer 2, which faces the substrate 1, is also referred to as the lower face 11 of the stack. The dielectric layer 3 lies between the first electrode layer 2 and second electrode layer 4. The second electrode layer 4, which lies above the first electrode layer 2 and dielectric layer 3 relative to the substrate 1, has an upper face 12, which is also referred to as the upper face 12 of the stack. The first electrode layer 2, dielectric layer 3, and second electrode layer 4 are generally flat and lie parallel to the substrate 1.

As shown in FIG. 1B, the stack also has a first side 13 and second side 14, which lie generally perpendicular to the substrate 1 and extend across the first electrode layer 2, dielectric layer 3, and second electrode layer 4.

The substrate 1 may be a silicon wafer or any other suitable substrate. The wafer can be bare, or with superconducting films (e.g., Nb/Al/TiN etc.) patterned with elements based on a coplanar waveguide. The first electrode layer 2 and the second electrode layer 4 are preferably formed of aluminium and the dielectric layer 3 is preferably formed of an aluminium oxide $Al_xO_y$, for example $Al_2O_3$. This selection of materials may be referred to as an $Al/Al_xO_y/Al$ trilayer. Methods for producing monocrystalline aluminium oxide dielectric layers using in-situ annealing or oxidation are known in the art, for example as described in Fritz et al., "Optimization of Al/AlOx/Al-layer systems for Josephson junctions from a microstructure point of view", Journal of Applied Physics 125, 165301 (2019).

In an alternative embodiment, the $Al/Al_xO_y/Al$ trilayer 2, 3, 4 is formed by physical vapor deposition ("PVD"), such as sputtering or electron beam evaporation and molecular beam epitaxy ("MBE"), after necessary pre-treatment such as a HF rinse and/or in-situ annealing of the substrate.

However, the process for producing high-quality monocrystalline $Al/Al_xO_y/Al$ trilayers using in-situ annealing requires high temperatures in order to form the trilayer, which prevents the use of shadow evaporation to form the structure of the Josephson junction. Furthermore, MBE is also incompatible with shadow evaporation as the resists used in shadow evaporation contaminate the MBE chamber.

The method of the present invention enables the structures of the Josephson junction to be formed from an $Al/Al_xO_y/Al$ trilayer formed by blanket deposition, thereby providing a Josephson junction with superior properties provided by the high-quality monocrystalline trilayer, such as improved critical current control, uniform tunnelling and reduced occurrence of two-level systems within the Josephson junction. However, the method of fabricating the Josephson junction does not require that these specific materials be used for the trilayer, thus other materials may be used for the first electrode layer 2, the second electrode layer 4, and insulating layer as long as the materials chosen are capable of forming a Josephson junction.

After the first electrode layer 2, the dielectric layer 3, and second electrode layer 4 have been formed, they are patterned by wet/dry etching to form the stack shown in FIG. 1B. The stack shown in FIG. 1B has an elongated shape, with its length being greater than its width and height. However, it should be appreciated that the relative dimensions and shape of the stack, as shown in the drawings, are merely exemplary. Furthermore, the layers 2, 3, and 4 of the stack may extend beyond the drawing or be part of a larger stack, as depicted in FIG. 9 and explained in more detail below. As long as the upper face 12 and sides 13, 14 are exposed, the method of the present disclosure may be carried out.

Figure 2A:
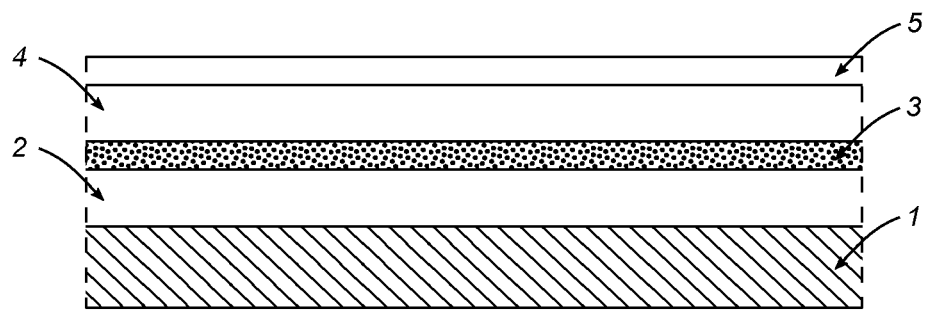
FIG. 2A is a diagram of a cross-sectional view of the electrode stack of FIG. 1A coated with a resist, according to an example embodiment of the present invention.
Figure 2B:
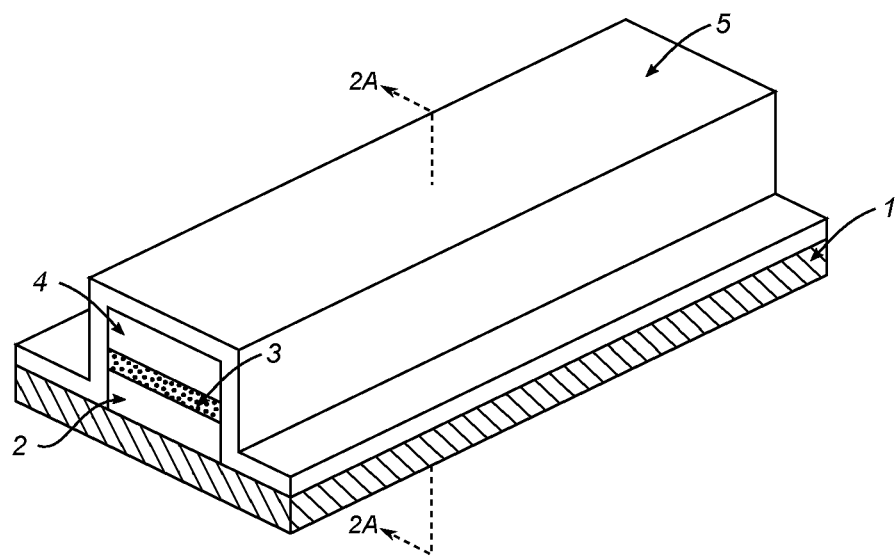
FIG. 2B is a diagram of a perspective view of the electrode stack of FIG. 2A, according to an example embodiment of the present invention.
Figure 3A:
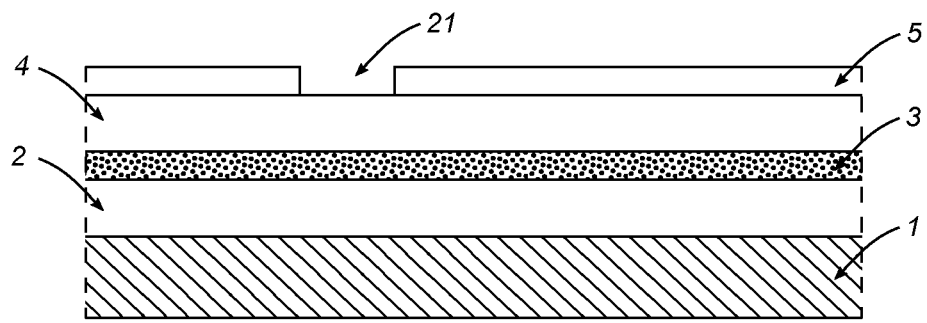
FIG. 3A is a diagram of a cross-sectional view of the electrode stack of FIG. 2A with an opening formed in the resist, according to an example embodiment of the present invention.
Figure 3B:
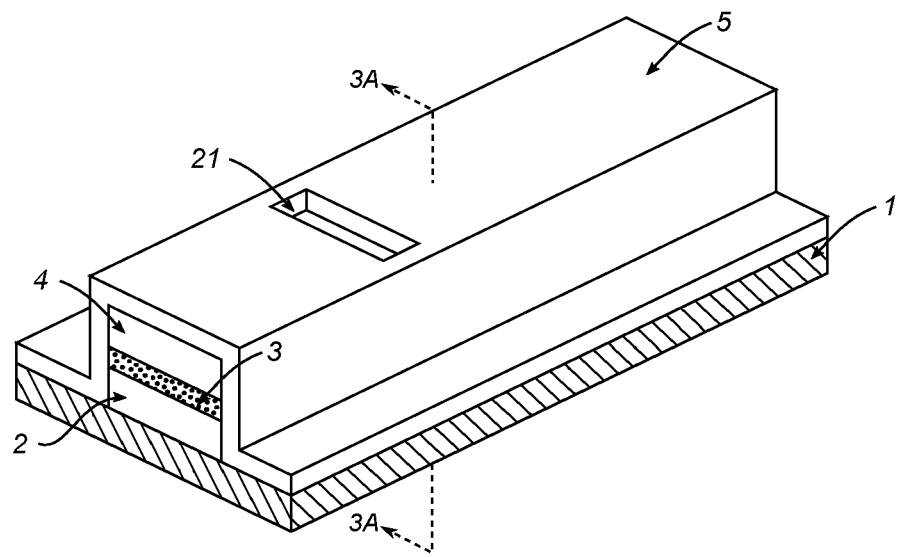
FIG. 3B is a diagram of a perspective view of the electrode stack of FIG. 3A, according to an example embodiment of the present invention.
Figure 4A:
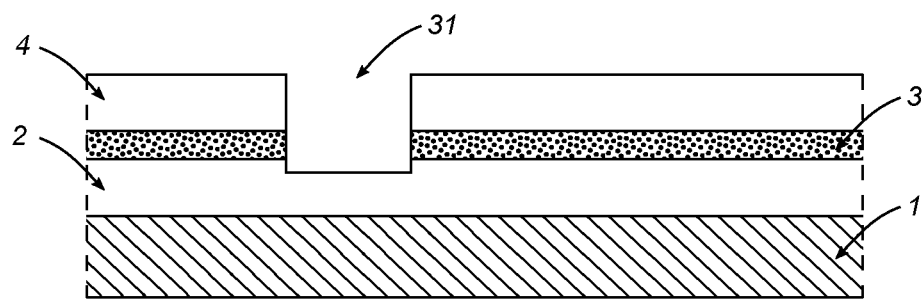
FIG. 4A is a diagram of a cross-sectional view of the electrode stack of FIG. 3A with a trench etched at the opening, according to an example embodiment of the present invention.
Figure 4B:
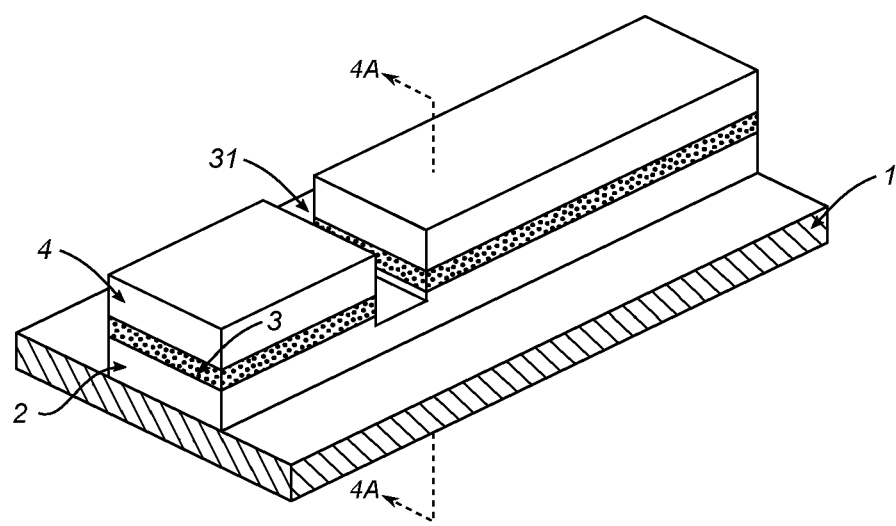
FIG. 4B is a diagram of a perspective view of the electrode stack of FIG. 4A, according to an example embodiment of the present invention.

FIGS. 2A and 2B show the following step in the process, in which the substrate 1 and stack 2, 3, 4 is coated with a resist 5. FIGS. 3A and 3B show an opening 21, which is formed in the upper surface of the resist 5 to expose a portion of the upper face 12 of the stack 2, 3, 4. The opening in the resist is formed by lithography. The stack is then wet/dry etched, via the opening 21 in the resist 5 to form a trench 31, which is shown in FIGS. 4A and 4B. After etching, the resist is removed, revealing the trench 31. The etching time is controlled such that the depth and width of the trench 31 extends all the way through the second electrode layer 4 and the dielectric layer 3, but the depth of the trench does not extend all the way through the first electrode layer 2.

Figure 5A:
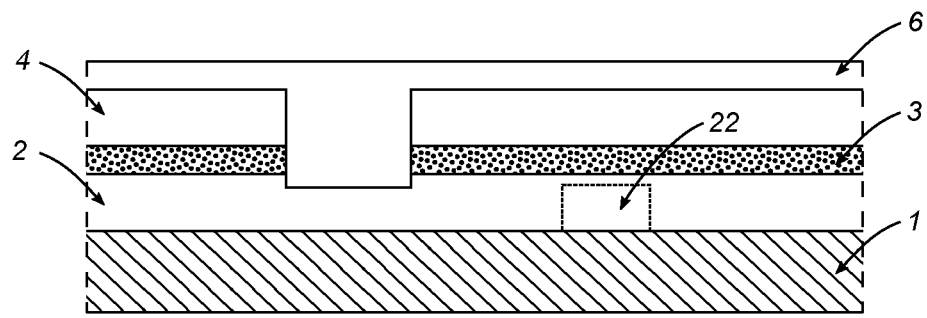
FIG. 5A is a diagram of a cross-sectional view of the electrode stack of FIG. 4A coated with another resist, according to an example embodiment of the present invention.
Figure 5B:
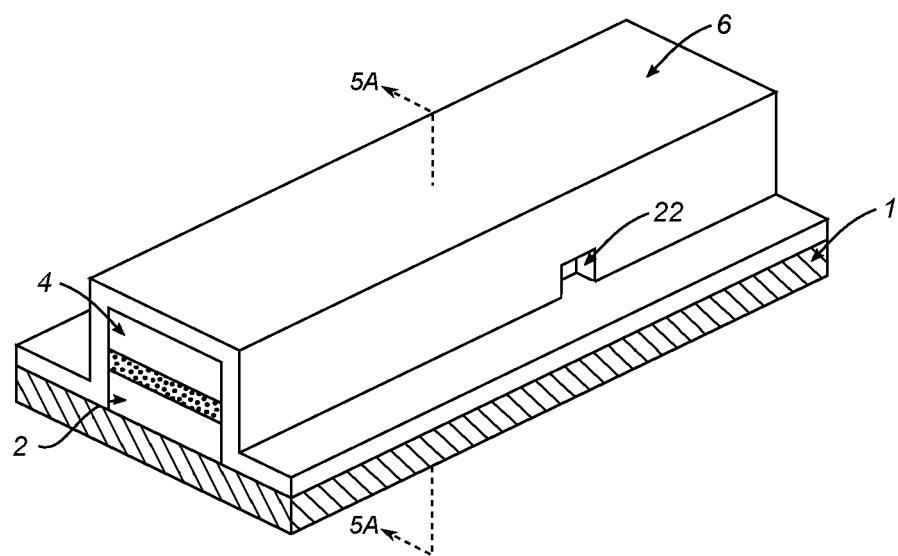
FIG. 5B is a diagram of a perspective view of the electrode stack of FIG. 5A, according to an example embodiment of the present invention.
Figure 6A:
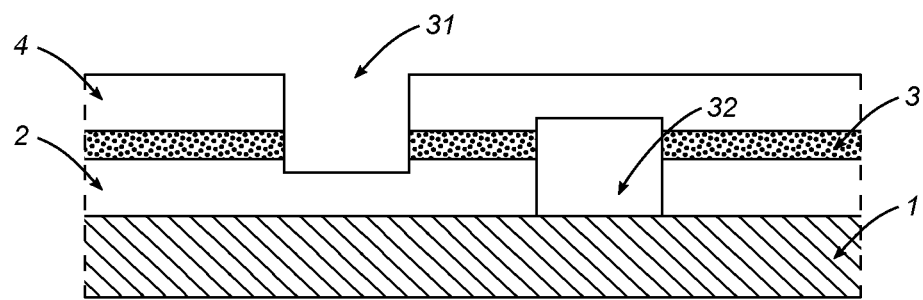
FIG. 6A is a diagram of a cross-sectional view of the electrode stack of FIG. 5A with an etched tunnel, according to an example embodiment of the present invention.
Figure 6B:
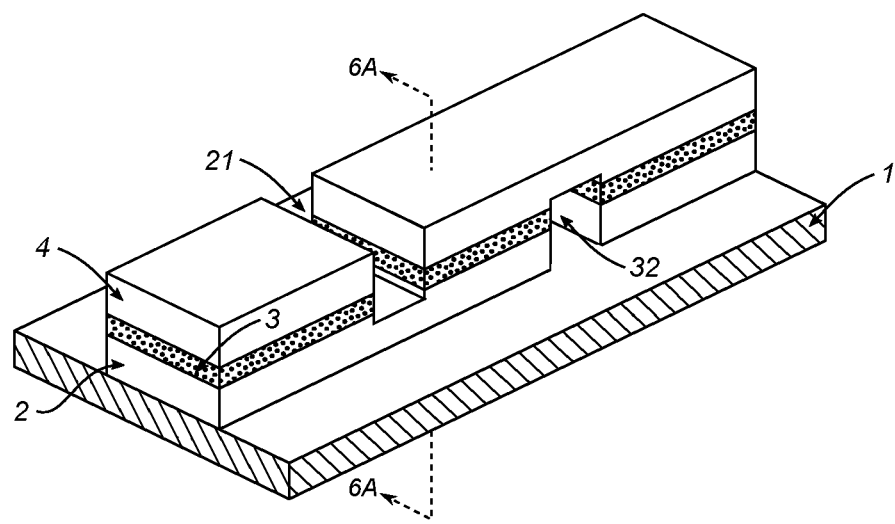
FIG. 6B is a diagram of a perspective view of the electrode stack of FIG. 6A, according to an example embodiment of the present invention.

As shown in FIGS. 5A and 5B, a second resist 6 is formed over the stack 2, 3, 4. The second resist 6 includes openings 22, which expose parts of the sides 13 and 14 of the stack. The openings 22 are located on opposite sides 13/14 of the stack 2, 3, 4. The opening 22 in the resist 6 is formed using multiphoton lithography. After the resist 6 and openings 22 have been formed, the stack is again wet/dry etched in order to form a tunnel 32, which extends from one side 13/14 of the stack to the other. The tunnel 32 is shown in FIGS. 6A and 6B. The etching time and the size of the openings 22 is controlled such that the height and width of the tunnel extend all the way through the first electrode layer 2 and the dielectric layer 3, but the height of the tunnel does not extend all the way through the second electrode layer 4. The result of the process, as depicted in FIGS. 6A and 6B, is a Josephson junction formed between the trench 31 and the tunnel 32.

Alternatively to the separate resists 5 and 6 shown in FIGS. 3A, 3B, 5A and 5B, the steps shown in these drawings may be combined in a single step, where a single resist is provided with both openings 21 and 22, and both the trench 31 and tunnel 32 may be etched in the same step. This may be achieved by selecting suitably sized openings 21 and 22 and etching times in order for the trench 31 and tunnel 32 to be formed with the desired dimensions simultaneously. In this case, multiphoton lithography is used to form both openings 21 and 22.

Figure 7A:
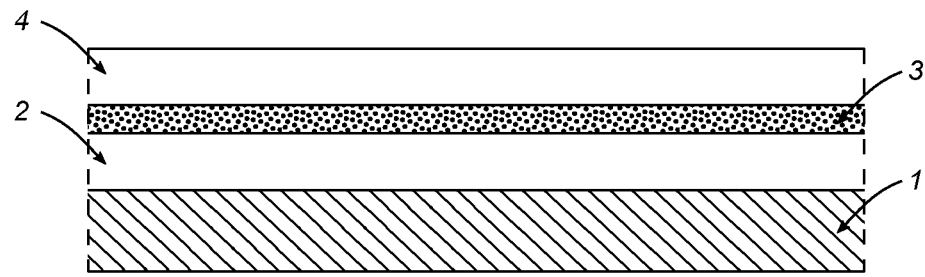
FIG. 7A is a diagram of a cross-sectional view of a trilayer including two electrode layers sandwiching a dielectric layer on a substrate, according to another example embodiment of the present invention.
Figure 7B:
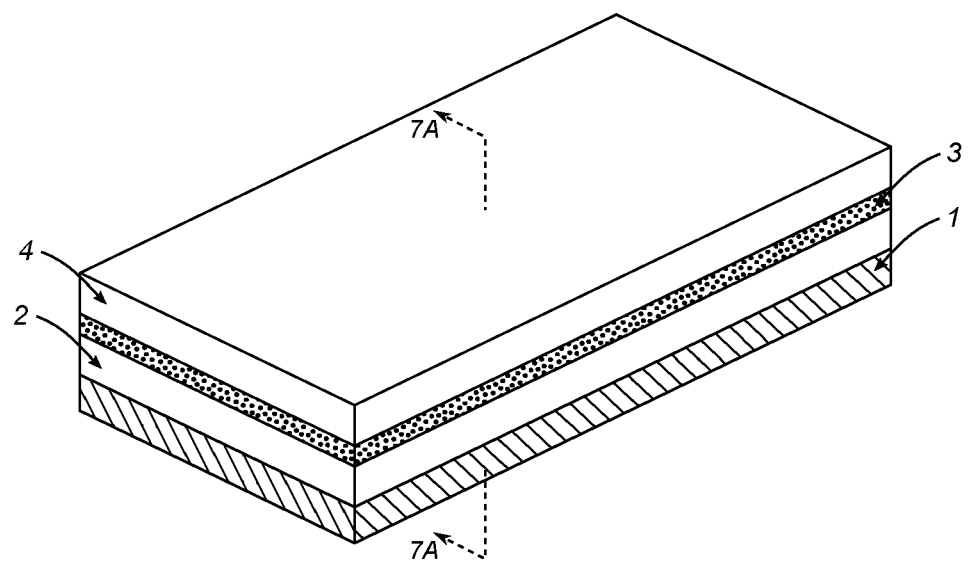
FIG. 7B is a diagram of a perspective view of the trilayer of FIG. 7A, according to an example embodiment of the present invention.

FIGS. 7A and 7B to 9A and 9B show additional process steps that relate to the formation of the overall structure of a superconducting quantum interference device (SQUID), of which the Josephson junction is a part. The Josephson junction or the SQUID formed by the process can be used as part of a superconducting qubit. In particular, the superconducting qubit is a non-linear microwave resonator that contains a Josephson junction/SQUID and a capacitor. The steps depicted in FIGS. 7A and 7B to 9A and 9B may be performed before the steps depicted in FIGS. 1A and 1B to 6A and 6B. FIGS. 7A and 7B show the results of a first step of deposition of the trilayer of the first electrode layer 2, dielectric layer 3 and second electrode layer 4 on to a substrate. The formation of the trilayer and the materials of each layer are the same as described above with respect to FIGS. 1A and 1B.

Figure 8A:
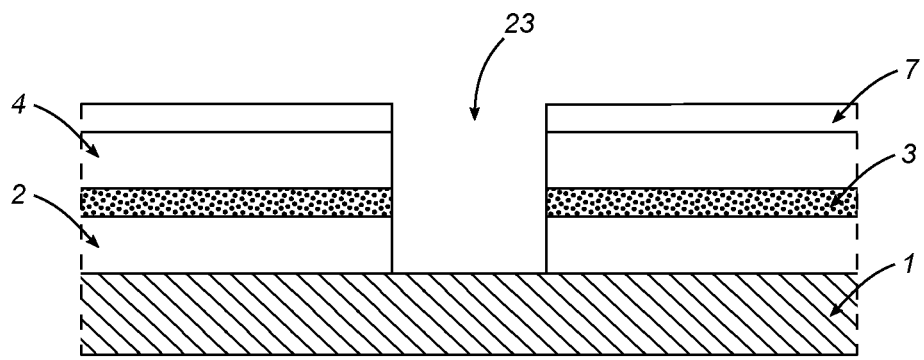
FIG. 8A is a diagram of a cross-sectional view of the trilayer of FIG. 7A after etching to form an opening, according to an example embodiment of the present invention.
Figure 8B:
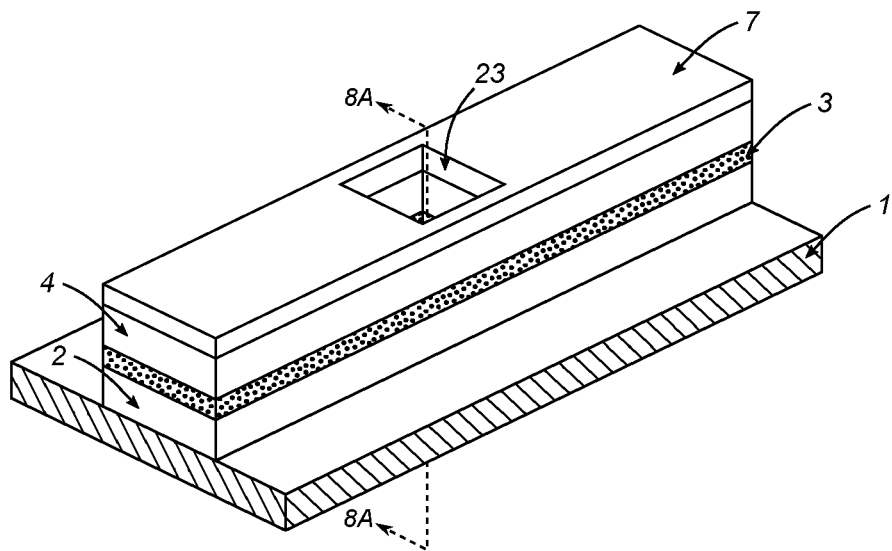
FIG. 8B is a diagram of a perspective view of the trilayer of FIG. 8A, according to an example embodiment of the present invention.

FIGS. 8A and 8B depict the form of the trilayer or stack 2, 3, 4 after a resist 7 has been applied and the stack has been etched in the general form of a SQUID loop, with an opening 23 in the middle of the resist, which is used to define the opening 33 in the middle of the stack 2, 3, 4. As described above, with respect to the resist 5, resist 7 may be formed by conventional lithography techniques and the trilayer 2, 3, 4 is etched using a wet/dry etching process.

Figure 9A:
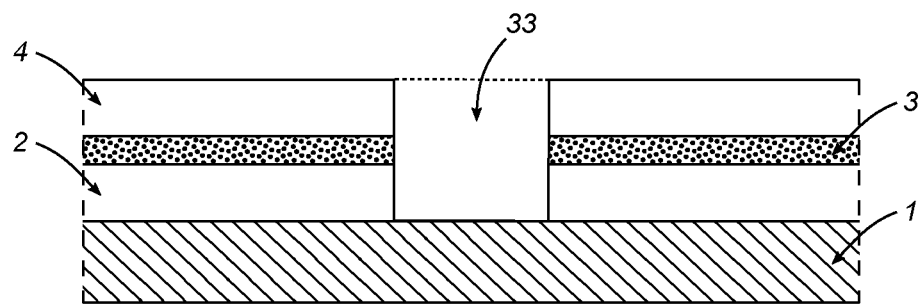
FIG. 9A is a diagram of a cross-sectional view of the trilayer after a resist is removed, according to an example embodiment of the present invention.
Figure 9B:
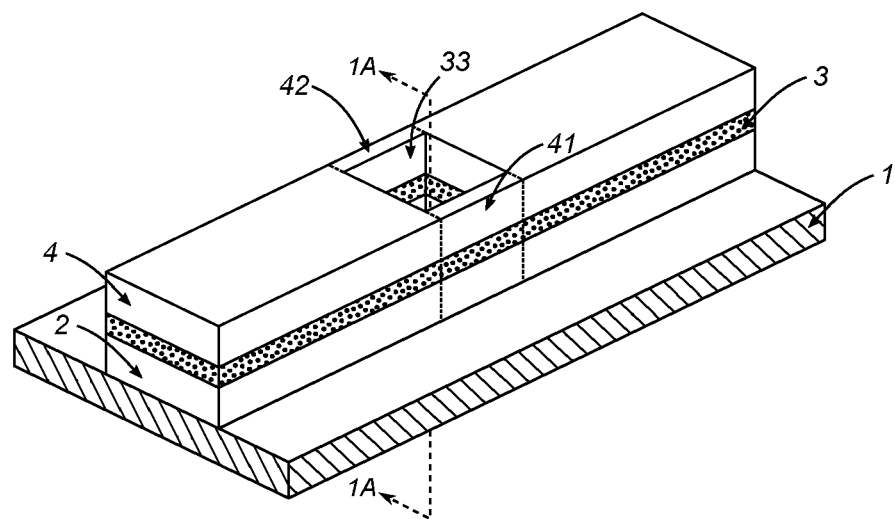
FIG. 9B is a diagram of a perspective view of the trilayer of FIG. 9A, according to an example embodiment of the present invention.
Figure 10:
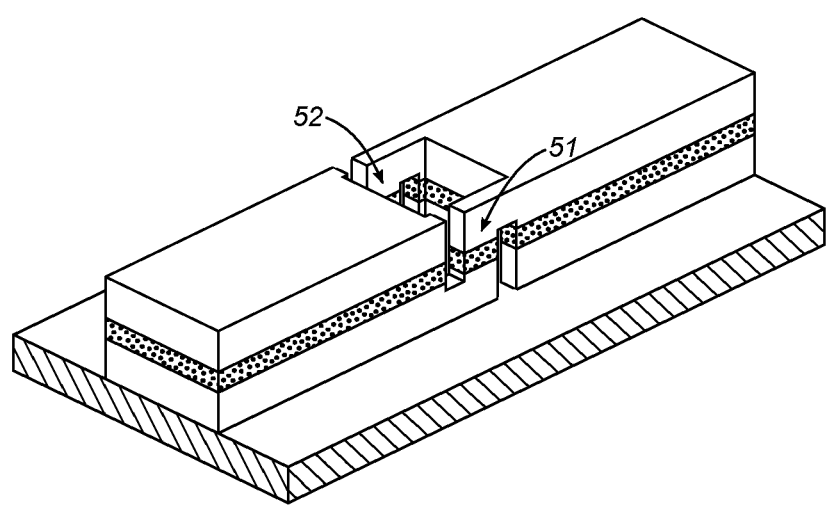
FIG. 10 shows a perspective view of a SQUID loop comprising two Josephson junctions formed according to the method of the present invention.

After etching to form the shape of the stack 2, 3, 4, the resist 7 is removed, leaving the shape depicted in FIGS. 9A and 9B. After the resist is removed, the remaining stack 2, 3, 4 includes the opening 33, which extends all the way through the stack 2, 3, 4 to the substrate 1. Each of the portions 41 and 42 of the stack 2, 3, 4, which are adjacent to the opening 33 on opposite sides of the opening, may then form the stack 2, 3, 4 as depicted in FIGS. 1A and 1B to 6A and 6B. Portions 41 and 42 may be referred to as "branches" of the SQUID loop. A Josephson junction may be formed on each of the portions 41 and 42 according to the method described above with respect to FIGS. 1A and 1B to 6A and 6B. The resulting SQUID loop comprises two Josephson junctions 51 and 52, as shown in FIG. 10.

Figure 11:
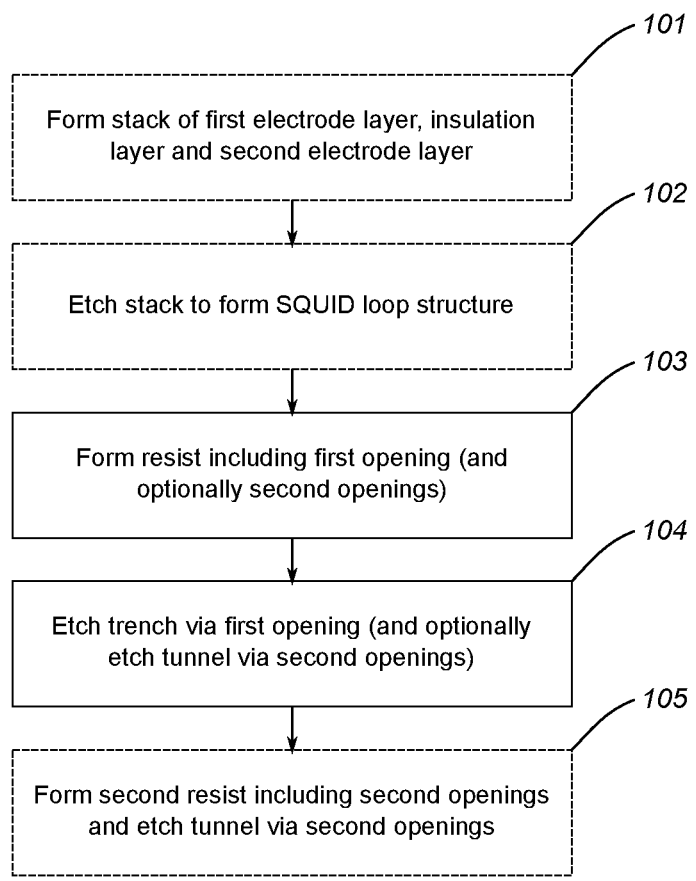
FIG. 11 is a flow diagram depicting a method of manufacturing a Josephson junction according to the present invention.

FIG. 11 depicts a method of manufacturing a Josephson junction as described above with respect to FIGS. 1A and 1B to 10. At step 101, the first stack of the first electrode layer 2, dielectric layer 3, and second electrode layer 4 is formed, as described above with respect to FIGS. 1A and 1B or, if the Josephson junction is formed as part of a SQUID loop, as shown in FIGS. 7A to 7B. At optional step 102, the stack may be etched into the form of the SQUID loop, as described above with respect to FIGS. 7A/7B to 9A/9B. If the Josephson junction is formed separately, or part of another structure, the method may proceed without step 102 of etching the shape of the SQUID loop, and instead the shape of the stack shown in FIG. 1B may be formed by etching. At step 103, the resist 5 is formed, as depicted in and described above with respect to FIGS. 2A and 2B, and the first opening 21 is formed in the resist, as depicted in and described with respect to FIGS. 3A and 3B. Optionally, where the trench 31 and tunnel 32 are formed simultaneously in the same etching step, second openings 22, which are depicted in and described with respect to FIGS. 5A and 5B, may also be formed in the first resist 5. At step 104, the trench 31, and optionally tunnel 32, are etched, as described above with respect to FIGS. 4A/4B and 6A/6B. At step 105, if the tunnel 32 was not etched simultaneously with the trench 31, then a second resist 6 may be formed over the stack and the second openings 22 may be formed therein, as described above with respect to FIGS. 5A and 5B. Subsequently, the tunnel may be etched, as described with respect to FIGS. 6A and 6B. Once all resists have been removed, the resulting Josephson junction is depicted in FIGS. 6A and 6B. Where the stack is first etched into the shape of the SQUID loop, both Josephson junctions 51 and 52 may be formed simultaneously by performing the process steps on each section 41, 42 of the SQUID loop simultaneously. In this case, the resulting device is shown in FIG. 10.

Where the Josephson junction shown in FIG. 6B, or the Josephson junctions 51 and 52 are intended to form part of a qubit, the other elements besides the Josephson junctions, such as a waveguide and a capacitor of the qubits, can be either fabricated before or after the fabrication of the Josephson junction(s). If the capacitor of the qubit is fabricated prior to the Josephson junction(s), it will be connected to the first electrode layer on both sides of the Josephson junction. If the capacitor of the qubit is fabricated after the junction, it will be connected to the top Al (aluminium) on both sides of the Josephson junction. The "trench-tunnel" structure described above enables leads to be connected to either the first or second electrode layers on either side of the Josephson junction, and thus eliminates the challenge of connecting to the second electrode layer without making a direct electrical short to the first electrode layer. For example, if the first electrode layer is connected on both sides of the Josephson junction, on the trench side of the junction, the supercurrent just flows through the first electrode layer. On the tunnel side of the junction, the existence of the tunnel focuses the supercurrent to flow from the first electrode layer to the second electrode layer. In essence, the Josephson junction defined by the "trench and tunnel" can therefore be seen as being in series with a much larger Josephson junction on the tunnel side (or on the trench side if it is connected to top Al on both sides). Since the Josephson junctions in series are much larger in size, it will not affect the properties of the qubit.

The invention claimed is:

1. A method of manufacturing a Josephson junction, the method comprising:
    forming a stack on a substrate, the stack comprising a first electrode layer, a dielectric layer, and a second electrode layer, the stack defining at least an upper surface, on the opposite face of the stack to the substrate, and two side surfaces adjacent to the substrate and the upper surface;
    forming a trench in the stack via a first opening in a first resist, the trench extending across a full width of the stack and extending across a full depth of the second electrode layer and the dielectric layer; and
    forming a tunnel in the stack via a second opening and a third opening in the first resist or a second resist, the second and third openings being formed by multiphoton lithography, the tunnel extending across the full width of the stack from the second opening to the third opening and extending across the full depth of the first electrode layer and the dielectric layer.

2. The method of claim 1, wherein prior to forming the stack, the method comprises:
    forming the first electrode layer, the dielectric layer, and the second electrode layer; and
    etching the first electrode layer, the dielectric layer, and the second electrode layer into a superconducting quantum interference device ("SQUID") loop shape.

3. The method of claim 2, wherein the SQUID loop shape is formed by etching the first electrode layer, the dielectric layer, and the second electrode layer via an opening in a third resist.

4. The method claim 2, wherein the SQUID loop shape comprises an elongated body which extends parallel to the substrate and includes an opening that extends perpendicular to the substrate through the first electrode layer, dielectric layer, and second electrode layer,
    wherein the opening is enclosed on all sides by the first electrode layer, dielectric layer, and second electrode layer, and
    wherein the sides of the opening that run parallel to the longitudinal axis of the elongated body are referred to as branches of the SQUID loop.

5. The method of claim 4, wherein the stack is formed from one of the branches of the SQUID loop.

6. The method of claim 1, wherein the first electrode layer, the dielectric layer, and the second electrode layer are formed by blanket deposition using physical vapor deposition ("PVD") or molecular beam epitaxy ("MBE").

7. The method of claim 6, wherein the first electrode layer, the dielectric layer, and the second electrode layer are formed after a pre-treatment including at least one of a hydrofluoric acid ("HF") rinse or in-situ annealing of the substrate.

8. The method of claim 1, wherein forming the trench comprises:
    forming the first resist over the stack covering at least the upper surface and the two side surfaces;
    creating the first opening in the first resist that exposes a portion of the upper surface of the stack; and
    wet or dry etching the stack to form the trench.

9. The method of claim 1, where forming the tunnel comprises:
    forming the second resist over the stack covering at least the upper surface and the two side surfaces;
    creating the second and third openings in the second resist, the second opening exposing a portion of a first of the two side surfaces of the stack, the third opening exposing a portion of a second of the two side surfaces of the stack opposite to the first side surface, the third opening being the same size as the second opening and located opposite the second opening; and
    wet or dry etching the stack to form the tunnel.

10. The method of claim 1, where forming the tunnel comprises:
    creating the second and third openings in the first resist, the second opening exposing a portion of a first of the two side surfaces of the stack, the third opening exposing a portion of a second of the two side surfaces of the stack opposite to the first side surface, the third opening being the same size as the second opening and located opposite the second opening; and
    wet or dry etching the stack to form the tunnel simultaneously with wet or dry etching the stack to form the trench.

11. The method of claim 10, wherein the method further comprises controlling an etch time of the trench so that the etching stops before first electrode layer is completely etched.

12. The method of claim 10, wherein the method further comprises controlling an etch time of the trench so that the etching stops before the second electrode layer is completely etched.

13. The method of claim 1, wherein the first and second electrode layers are aluminium, and wherein the dielectric layer is an aluminium oxide.

14. The method of claim 13, wherein the aluminium oxide of the dielectric layer has a monocrystalline structure.

15. The method of claim 1, further comprising connecting at least one of the first electrode layer or the second electrode layer to one or more further electrical components to form a qubit.

* * * * *